(12) United States Patent
Le et al.

(10) Patent No.: US 11,699,704 B2
(45) Date of Patent: Jul. 11, 2023

(54) MONOLITHIC INTEGRATION OF A THIN FILM TRANSISTOR OVER A COMPLIMENTARY TRANSISTOR

(71) Applicant: Intel Corporation, Santa Clara, CA (US)

(72) Inventors: Van H. Le, Portland, OR (US); Marko Radosavljevic, Portland, OR (US); Han Wui Then, Portland, OR (US); Willy Rachmady, Beaverton, OR (US); Ravi Pillarisetty, Portland, OR (US); Abhishek Sharma, Hillsboro, OR (US); Gilbert Dewey, Hillsboro, OR (US); Sansaptak Dasgupta, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 22 days.

(21) Appl. No.: 16/642,356

(22) PCT Filed: Sep. 28, 2017

(86) PCT No.: PCT/US2017/054144
§ 371 (c)(1),
(2) Date: Feb. 26, 2020

(87) PCT Pub. No.: WO2019/066872
PCT Pub. Date: Apr. 4, 2019

(65) Prior Publication Data
US 2021/0074702 A1 Mar. 11, 2021

(51) Int. Cl.
*H01L 27/092* (2006.01)
*H01L 21/8258* (2006.01)
(Continued)

(52) U.S. Cl.
CPC ...... *H01L 27/0922* (2013.01); *H01L 21/8258* (2013.01); *H01L 27/0883* (2013.01);
(Continued)

(58) Field of Classification Search
CPC ............ H01L 21/8258; H01L 27/0883; H01L 27/0922; H01L 29/2003; H01L 29/205;
(Continued)

(56) References Cited

U.S. PATENT DOCUMENTS 7,419,892 B2 * 9/2008 Sheppard .......... H01L 21/26553
257/E29.104
7,821,032 B2 * 10/2010 Kinzer ................ H01L 29/7786
257/E29.252

(Continued)

FOREIGN PATENT DOCUMENTS

| JP | 2015165579 | 9/2015 |
| JP | 2016009774 A | 1/2016 |
| WO | 2017142482 A1 | 8/2017 |

OTHER PUBLICATIONS

Heineck et al., "Zinc Tin Oxide Thin-Film-Transistor Enhancement/Depletion Inverter", IEEE Electron Device Letters 30 (2009) pp. 514-516.*

(Continued)

*Primary Examiner* — Jay C Kim
(74) *Attorney, Agent, or Firm* — Finch & Maloney PLLC

(57) ABSTRACT

A semiconductor device comprising stacked complimentary transistors are described. In some embodiments, the semiconductor device comprises a first device comprising an enhancement mode III-N heterostructure field effect transistor (HFET), and a second device over the first device. In an example, the second device comprises a depletion mode thin (Continued)

film transistor. In an example, a connector is to couple a first terminal of the first device to a first terminal of the second device.

20 Claims, 6 Drawing Sheets

(51) Int. Cl.
*H01L 27/088* (2006.01)
*H01L 29/20* (2006.01)
*H01L 29/205* (2006.01)
*H01L 29/66* (2006.01)
*H01L 29/778* (2006.01)
*H01L 29/786* (2006.01)

(52) U.S. Cl.
CPC ........ *H01L 29/2003* (2013.01); *H01L 29/205* (2013.01); *H01L 29/66462* (2013.01); *H01L 29/66969* (2013.01); *H01L 29/7786* (2013.01); *H01L 29/7869* (2013.01)

(58) Field of Classification Search
CPC ......... H01L 29/66462; H01L 29/66969; H01L 29/7786; H01L 29/7869
See application file for complete search history.

(56) References Cited

U.S. PATENT DOCUMENTS

| | | | |
|---|---|---|---|
| 7,825,435 B2* | 11/2010 | Machida | H03K 17/74 257/195 |
| 7,915,645 B2* | 3/2011 | Briere | H01L 29/872 257/195 |
| 7,952,392 B2 | 5/2011 | Koyama et al. | |
| 9,041,067 B2* | 5/2015 | Briere | H03K 17/567 257/195 |
| 9,048,838 B2* | 6/2015 | Otremba | H01L 24/41 |
| 9,184,243 B2* | 11/2015 | Briere | H01L 21/8258 |
| 9,196,689 B2* | 11/2015 | Correia Fortunato | H01L 21/02565 |
| 9,257,424 B2* | 2/2016 | Hirler | H01L 29/267 |
| 9,276,569 B2* | 3/2016 | Ikeda | H01L 25/18 |
| 9,318,593 B2* | 4/2016 | Wu | H01L 29/7786 |
| 9,356,054 B2* | 5/2016 | Miyairi | H01L 27/1225 |
| 9,362,267 B2* | 6/2016 | Briere | H01L 25/18 |
| 9,406,674 B2* | 8/2016 | Briere | H01L 27/0883 |
| 9,525,063 B2* | 12/2016 | Otremba | H01L 27/0688 |
| 9,570,600 B2* | 2/2017 | Lu | H01L 21/30612 |
| 9,899,516 B2* | 2/2018 | Gu | H01L 29/40111 |
| 9,947,777 B2* | 4/2018 | Yamazaki | H01L 21/02565 |
| 9,954,113 B2* | 4/2018 | Shimomura | H01L 29/7869 |
| 10,050,152 B2* | 8/2018 | Yamazaki | H01L 27/1255 |
| 10,411,013 B2* | 9/2019 | Godo | H01L 29/7869 |
| 10,490,553 B2* | 11/2019 | Yamazaki | H01L 29/7869 |
| 10,930,676 B2* | 2/2021 | Schuette | H01L 21/8252 |
| 2008/0080221 A1 | 4/2008 | Koo et al. | |
| 2014/0091366 A1 | 4/2014 | Jeon et al. | |
| 2014/0367744 A1* | 12/2014 | Briere | H01L 21/8258 257/195 |
| 2015/0108472 A1* | 4/2015 | Suzawa | H01L 27/1255 257/43 |
| 2015/0162321 A1* | 6/2015 | Briere | H01L 29/778 257/195 |
| 2015/0214256 A1* | 7/2015 | Miyairi | H01L 27/088 257/43 |
| 2015/0318515 A1* | 11/2015 | Han | H01L 51/5271 257/40 |
| 2015/0325708 A1 | 11/2015 | Yakubo et al. | |
| 2016/0133627 A1 | 5/2016 | Hirler | |
| 2017/0033187 A1 | 2/2017 | Rajan et al. | |
| 2017/0125562 A1 | 5/2017 | Prechtl et al. | |
| 2017/0141130 A1* | 5/2017 | Yamazaki | H01L 29/7869 |
| 2018/0323295 A1* | 11/2018 | Okayasu | H01L 29/2003 |

OTHER PUBLICATIONS

International Preliminary Report on Patentability from PCT/US2017/054144 dated Apr. 9, 2020, 12 pgs.
International Search Report and Written Opinion for International Patent Application No. PCT/US2017/054144, dated Jun. 28, 2018.
Extended European Search Report received for EP Application No. 17927294.3, dated May 27, 2021. 11 pages.
Schuette, et al., "Heterogeneous integration of low-temperature metal-oxide TFTs", Proceedings of SPIE; vol. 10105, Feb. 24, 2017. 7 pages.

* cited by examiner

MONOLITHIC INTEGRATION OF A THIN FILM TRANSISTOR OVER A COMPLIMENTARY TRANSISTOR

CLAIM OF PRIORITY

This Application is a National Stage Entry of, and claims priority to, PCT Application No. PCT/US2017/054144, filed on Sep. 28, 2017 and titled "MONOLITHIC INTEGRATION OF A THIN FILM TRANSISTOR OVER A COMPLIMENTARY TRANSISTOR," which is incorporated by reference in its entirety for all purposes.

BACKGROUND

Various circuits, such as an inverter circuit, may use an adjacent complimentary pair of transistors, e.g., a depletion mode transistor and an enhancement mode transistor. In various applications, a III-N transistor, e.g., a GaN based transistor, may be used as the enhancement mode transistor. However, as discussed in further detail herein, it may not be feasible in some examples to use a GaN depletion mode transistor adjacent to the GaN enhancement mode transistor to form such circuits.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
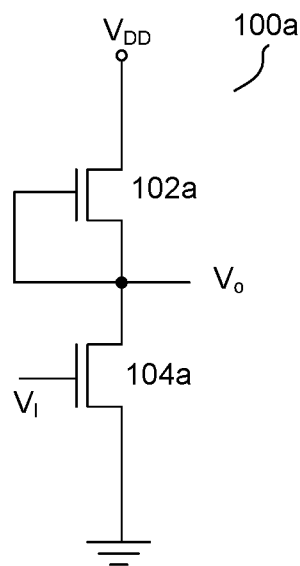
FIGS. 1A and 1B illustrate example circuits using complementary transistors, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/ material. Similar distinctions are to be made in the context of component assemblies.

As used throughout this description, and in the claims, a list of items joined by the term "at least one" of or "one or more of" can mean any combination of the listed terms. For example, the phrase "at least one of A, B or C" can mean A; B; C; A and B; A and C; B and C; or A, B and C.

Various circuits, such as an inverter circuit, may use an adjacent complimentary pair of transistors, e.g., a depletion mode transistor and an enhancement mode transistor. In various applications (e.g., Radio Frequency (RF) communication), it may be desirable to use a III-N transistor, e.g., a GaN transistor, such as a heterostructure field effect transistor (HFET), a high electron mobility transistor (HEMT), a metal oxide semiconductor (MOS) HEMT, etc. as the enhancement mode transistor. However, as discussed in further detail herein, it may not be feasible in some examples to use a GaN depletion mode transistor adjacent to the GaN enhancement mode transistor. Accordingly, various embodiments of this disclosure discuss using a depletion mode thin film transistor (TFT) in conjunction with the enhancement mode GaN transistor (or an enhancement mode transistor of another type) to form such an inverter circuit. For example, the TFT may be formed over the GaN transistor, and may be connected in series to form the inverter circuit.

FIG. 1A illustrates an example circuit 100a using complementary transistors, in accordance with some embodiments. For example, the circuit 100a is an inverter circuit receiving a voltage $V_{DD}$, an input $V_1$ and an output $V_o$. The circuit 100a comprises a transistor 102a in series with another transistor 104a. In an example, the transistors 102a and 104a are complementary transistors. For example, the transistor 102a may be a depletion mode transistor, while the transistor 104a may be an enhancement mode transistor. In an example, the transistor 104a may act as a driver of the circuit 100a, and the transistor 102a may act as a load of the circuit 100a. Thus, the transistors 102a and 104a may respectively be a load transistor and a driver transistor of the circuit 100a.

Figure 1B:
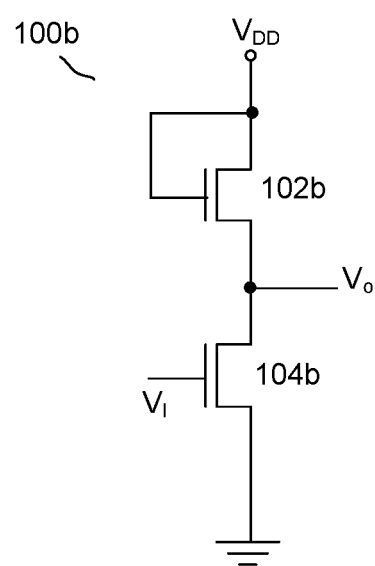

FIG. 1B illustrates another example circuit 100b using complementary transistors, in accordance with some embodiments. For example, the circuit 100b is another inverter circuit receiving a voltage $V_{DD}$, an input $V_1$ and an output $V_o$. The circuit 100b comprises a transistor 102b is series with another transistor 104b. In an example, the transistors 102b and 104b are complementary transistors. For example, the transistor 102b may be a depletion mode transistor, while the transistor 104b may be an enhancement mode transistor. In an example, the transistor 104b may act as a driver of the circuit 100b, and the transistor 102b may act as a load of the circuit 100b. Thus, the transistors 102b and 104b may respectively be a load transistor and a driver transistor of the circuit 100b.

Figure 2:
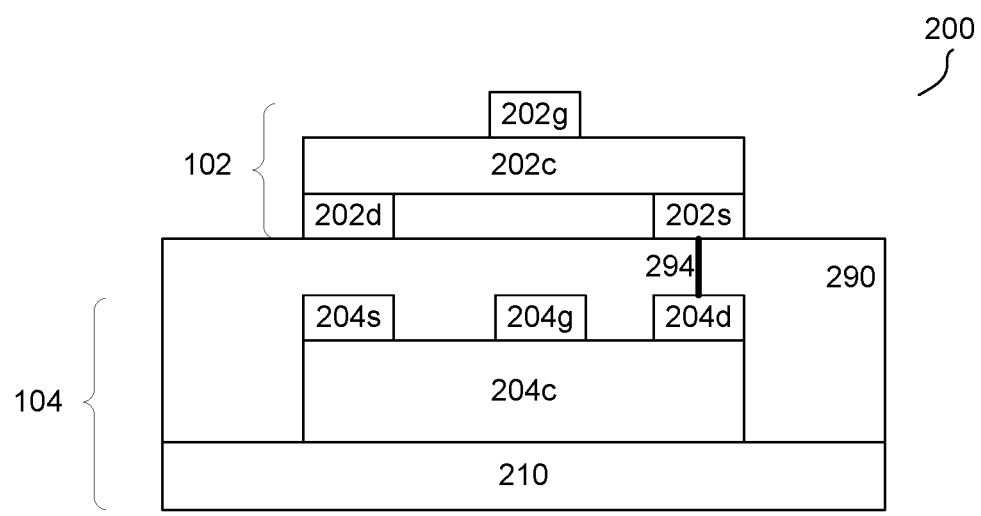
FIG. 2 schematically illustrates a semiconductor device comprising stacked top and bottom transistors, where the top transistor is a thin film transistor, and wherein the top and bottom transistors are of complementary types, in accordance with some embodiments.

FIG. 2 schematically illustrates a semiconductor device 200 comprising complementary stacked transistors 102 and 104, where the transistor 102 is a thin film transistor, in accordance with some embodiments. The transistors 102 and 104 are schematically or symbolically illustrated in FIG. 2, and may not reflect an actual structure of the transistors.

For example, the device 200 comprises a semiconductor substrate 210, over which the transistor 104 may be formed.

The transistor 104 may comprise source 204s, drain 204d, channel 204c, and gate 204g, although the relative position and structure of these components illustrated in FIG. 2 may not reflect the actual position and structure of these components. The device 200 may further comprise Interlayer Dielectric (ILD) 290 surrounding the transistor 104. Although the transistor 104 is likely to include various other components (e.g., a polarization layer, a two-dimensional electron gas (2DEG) region, a buffer layer, and/or the like), such components are not illustrated in FIG. 2 for purposes of illustrative clarity.

In some embodiments, the device 200 may further comprise the transistor 102 formed over the transistor 104. For example, the transistor 102 may be formed on the ILD 290 (although in some examples, such ILD 290 may be absent, and the transistor 102 may be formed at least in part on the transistor 104). The transistor 102 may comprise source 202s, drain 202d, channel 202c, and gate 202g, although the relative position and structure of these components illustrated in FIG. 2 may not reflect the actual position and structure of these components. Although the transistor 102 is likely to include various other components (e.g., a thin film layer, a passivation layer, a dielectric layer, and/or the like), such components are not illustrated in FIG. 2 for purposes of illustrative clarity.

In some embodiments, the transistor 102 may comprise a thin film transistor (TFT), e.g., formed on a thin film. For example, one or more layers or components of the transistor 102 may be formed via an appropriate deposition process of a thin film oxide semiconductor layer, such as, but not limited to pulsed laser deposition (PLD), oxidation processing where a precursor is spin-coated and oxidized during an anneal, chemical vapor deposition (CVD), atomic layer deposition (ALD), and/or the like.

In some embodiments, the transistors 102 and 104 may be of complementary types. In an example, the transistor 102 may be an enhancement mode transistor, and the transistor 104 may be a depletion mode transistor. In another example, the transistor 104 may be an enhancement mode transistor, and the transistor 102 may be a depletion mode transistor.

In some embodiments, the transistor 104 may be any appropriate transistor formed using any appropriate technology. For example, the transistor 104 may be a III-N heterostructure field effect transistor (HFET), such as a high electron mobility transistor (HEMT) and metal oxide semiconductor (MOS) HEMT, e.g., a GaN transistor. In another example, the transistor 104 may be a Silicon based transistor, III-V based transistor, or another appropriate type of transistor.

In some embodiments, the source 202s of the transistor 102 may be coupled to the drain 204d of the transistor 104 (e.g., via a drain contact of the drain 204d, not illustrated in FIG. 2), via a connection 294. Although not illustrated in FIG. 2, the source 204s and the drain 204d may have respective source and drain contacts. Although not illustrated in FIG. 2, the connection 294 may comprise one or more metallization layers disposed between the transistors 102 and 104.

In some embodiments, the transistor 104 of FIG. 2 may correspond to the transistors 104a or 104b of FIG. 1A or 1B, respectively. For example, the transistor 104 may be an enhancement mode transistor, which may form a driver transistor of the circuit 100a or 100b. In some of these embodiments, the transistor 104 may be a III-N HFET (e.g., a GaN transistor), such as a HEMT or a MOS HEMT. In some embodiments, the transistor 102 of FIG. 2 may correspond to the transistors 102a or 102b of FIG. 1A or 1B, respectively. For example, the transistor 102 may be a depletion mode transistor, which may form a load transistor of the circuit 100a or 100b.

Figure 3:
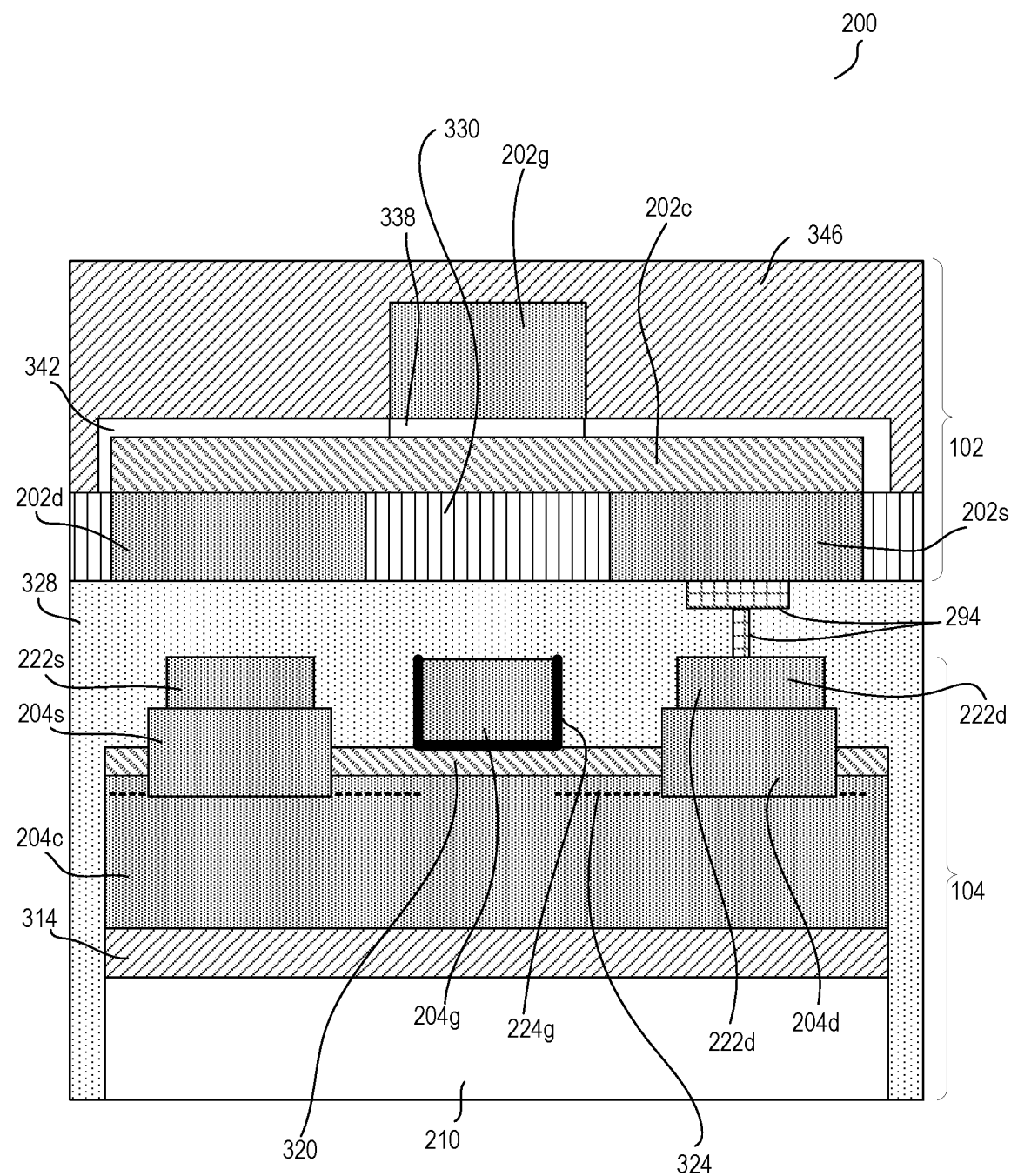
FIG. 3 illustrates a cross-sectional view of an example implementation of the semiconductor device of FIG. 2, in accordance with some embodiments.

FIG. 3 illustrates a cross-sectional view of an example implementation of the semiconductor device 200 of FIG. 2, in accordance with some embodiments. In the example of FIG. 3, the transistor 104 may be an enhancement mode III-N transistor (e.g., a HFET), and the transistor 102 may be a depletion mode TFT.

III-N HFET, such as HEMT and MOS HEMT, employ a semiconductor heterostructure with one or more heterojunction, for example at an interface of a GaN semiconductor and another III-N semiconductor alloy, such as AlGaN or AlInN. GaN-based HFET devices benefit from the relatively wide bandgap (~3.4 eV), enabling higher breakdown voltages than Si-based MOSFETs. The structure of the enhancement mode III-N HFET (e.g., the transistor 104) illustrated in FIG. 3 is merely an example, and in some embodiments, any other appropriate enhancement mode III-N HFET may be used, e.g., instead of the transistor 104 depicted in FIG. 3.

In some embodiments, the transistor 104 may be formed on a substrate 210, which may be substantially monocrystalline with a predetermined crystal orientation. Substrate 210 may comprise a variety of materials, including, but not limited to, GaN, SiC, sapphire, and silicon. The substrate crystallographic orientation may be any of (100), (111), (110). Other crystallographic orientations may also be possible and a range of miscut (e.g., 4-11° may be utilized for better lattice matching between substrate 210 and an overlying semiconductor buffer 314.

In some embodiments, the semiconductor buffer 314 may have a wide variety of compositions and structures designed to confine lattice defects. In an embodiment, the semiconductor buffer 314 may be a first III-N layer interfacing with a non-III-N substrate 210. In an example, the semiconductor buffer 314 may comprise one or more GaN material layers, one or more AlN material layers, and/or the like.

In some embodiments, the transistor 104 may comprise a channel layer 204c. The channel layer 204c may be formed over the semiconductor buffer 314. In some embodiments, the channel layer 204c may comprises GaN. In some embodiments, the channel layer 204c may be binary alloy GaN, and may be substantially undoped to have a carrier mobility of about 1100 cm2/V*s, or more (or less).

A source 204s and a drain 204d may be formed adjacent to the channel layer 110. The source 204s and the drain 204d may be impurity doped semiconductor regions (e.g., with Si for n-type). The impurity doped semiconductor regions comprising the source 204s and the drain 204d may be, for example, low bandgap group III-N material, such as InxGa1-xN and/or InN, for low resistance, or may be simply n-type (e.g., Si-doped) GaN, where x may range from 0 to 0.2. In an example, the impurity doping level may be any typically employed for an N+ source/drain of a GaN device. For example, the source 204s and the drain 204d may have a dopant concentration of at least 1e18 atoms/cm3. For some embodiments, the raised doped N+ material may be substantially monocrystalline. Dislocation density within the source 204s and the drain 204d may be between 109 cm-2 and 1012 cm-2, for example. Material having many orders of magnitude higher dislocation density is also possible, and in some embodiments source and drain regions 204s and 204d may be polycrystalline. Source and drain semiconductor may be of any composition known to be suitable for the device layer material compositions. In some embodiments, the source 204s and the drain 204d may have corresponding metal contacts 222s and 222d, respectively.

In some embodiments, a polarization layer 320 may be formed over and adjacent to the channel layer 204c. The polarization layer 320 may be coupled between the source 204s and the drain 204d.

In some embodiments, the polarization layer 320 may include one or more polarization material, e.g., InAlGaN, AlN, AlInN, AlGaN, InGaN. For example, the polarization layer 320 may comprise InxAlyGa1-x-yN.

In some embodiments, the polarization layer 320 may create a two-dimensional electron gas (2DEG) region 324 within the channel layer 204c, near the heterojunction of the polarization layer 320 and the channel layer 204c. In an example, the source 204s and the drain 204d may be electrically coupled through the 2DEG region 324.

In some embodiments, the transistor 104 may further comprise a gate stack 204g adjacent to the polarization layer 320, e.g., to tune a threshold voltage (Vt) of the transistor 104. The gate stack 204g may include a gate electrode that may be any metal or semiconductor known to have suitable conductivity and work function. In an example, the gate electrode may be a workfunction metal that may be a mid-gap metal, such as, but not limited to TiN, or slightly p-type, such as, but not limited to a Ni/Au alloy. The gate electrode may electrostatically couple to the channel layer 204c through the field effect. The gate stack 204g may further include a gate dielectric 224g (symbolically illustrated using a thick line), such as any high-k or conventional dielectric material known to be suitable for III-N FETs or III-N devices. For example, the gate dielectric may be a material that has a bulk dielectric constant of 7, or more. In some embodiments, gate dielectric may be Al2O3. Other dielectric materials, such as, but not limited to group III-ON, and other high-k dielectrics such as Gd2O3, HfO2, Ta2O5, ZrO2, high-K metal silicates such as HfOSiO, TaSiyOx, AlSiO, and other high-K oxynitrides such as HfON, AlON, ZrSiON, HfSiON may also be suitable as gate dielectric.

In some embodiments, the transistor 104 may comprise interlayer dielectric (ILD) 328 covering the source/drain 204s, 204d, and the gate 204g. One or more metallization levels or metallization layers may be formed within the ILD 328 (although such metallization levels are not illustrated in detail in FIG. 3). For example, the connection 294 between the transistors 102 and 104 may be realized at least in part using the metallization levels. The connection 294, in some examples, may be an example connection, and in some embodiments, another connection may be used in addition to, or instead of, the connection 294. In some embodiments, the source 202s and the drain contact 222d may be directly attached (or attached via one or more other layers), thereby eliminating the connection 294. A structure and/or a shape of the connection 294 illustrated in various figures are merely examples.

Referring now to the transistor 102, in some embodiments, the transistor 102 may be a TFT (e.g., a depletion mode TFT). TFTs are a class of field-effect transistors (FETs) in which the channel material may be a deposited thin film, rather than a monocrystalline material. A common application of TFT technology is liquid crystal displays (LCD), but they are also advantageous in other applications as the thin film deposition processes employed in TFT fabrication are relatively low (e.g., below 450° C.). TFTs can be made using a wide variety of semiconductor materials, such as silicon, germanium, silicon-germanium, as well as various oxide semiconductors (a.k.a. semiconducting oxides) including amorphous metal oxides. The structure of the transistor 102 illustrated in FIG. 3 is merely an example, and in some embodiments, any other appropriate TFT may be used, e.g., instead of the transistor 102 depicted in FIG. 3.

The transistor 102 illustrates a top-side gate architecture, with bottom-side source/drain contacts, although other type of TFT architecture may also be possible. In some embodiments, the transistor 102 may comprise a semiconductor thin film 202c that may be disposed under a gate dielectric 338. Source 202s and drain 202d may be surrounded by a substrate layer 330. In some embodiments, substrate layer 330 may be amorphous. Substrate 330 may be any dielectric material, such as, but not limited to, silicon dioxide (SiO), a silicon nitride (SiN), silicon oxynitride (SiON), or low-k dielectric (e.g., having a dielectric constant below 3.5).

In some embodiments, the gate stack 202g may be formed over the gate dielectric 338, e.g., to modulate the oxide semiconductor between intrinsic and n-type or p-type material through the field effect. Gate dielectric 338 is to form an interface of suitable quality. In some exemplary embodiments, gate dielectric 338 comprises a high-k dielectric having a bulk relative dielectric constant greater than at least 9. The gate dielectric may include one or more material layers. In some such embodiments, the high-k gate dielectric comprises a metal oxide. In some embodiments, the metal oxide comprises at least one of Al2O3, HfO2, TiO2, TaO2, or HfAlOx in direct contact with oxide semiconductor thin film 202c. Silicates such as HfSiOx or TiSiOx may also be suitable for either direct contact with oxide semiconductor thin film 202c, or with a layer of gate dielectric 338 interfacing with oxide semiconductor thin film 202c. HfO2 may give better gate control in some embodiments than alternatives such as Al2O3. However, both Al2O3, HfO2 have been found to display results superior to silicon-based dielectrics (e.g., SiO2).

In some embodiments, gate electrode 202g may include a metal. The metal gate electrode may include an elemental metal layer, a metal alloy layer, or laminate structure of either or both. In some embodiments, the gate electrode 202g may be a metal nitride, such as TiN (e.g., with a work function of 4.0-4.7 eV). The gate 202g electrode may also comprise Al (e.g., TiAlN). Other alloy constituents may also be employed, such as, but not limited to C, Ta, W, Pt, and Zn. Gate electrode 202g may have any lateral critical dimension.

While semiconductor thin film 202c may have any composition known to be suitable as a TFT channel material, such as a group IV material (e.g., Si, Ge, SiGe), in some advantageous embodiments semiconductor thin film 202c may be an oxide semiconductor. An oxide semiconductor is a semiconducting oxide. Oxide semiconductors can be advantageous for low temperature transistor fabrication, and can have excellent transistor characteristics offering high carrier mobility and a tunable material band gap and resistivity. Many oxide semiconductors have been studied, initially in the context of discrete rectifiers, and more recently in the context of transparent TFTs for display applications. Examples include metal oxides with a transition metal (e.g., IUPAC group 4-10) or post-transition metal (e.g., IUPAC groups 11-15). In advantageous embodiments, the metal oxide includes at least one of Mg, Cu, Zn, Sn, Ti, Ni, Ga, In, Sb, Sr, Cr, Co, V, or Mo. The metal oxides may be suboxides (A2O), monoxides (AO), binary oxides (AO2), ternary oxides (ABO3), and mixtures thereof.

Oxide semiconductor thin film 202c may be a p-type, n-type, or intrinsic material. A number of oxide semiconductors have been found to be capable of significant electron densities. Some oxide semiconductors have also been found to be capable of significant electron hole densities. Many oxide semiconductors have high defect density nearer the valence band, but display good n-type electrical properties. Some oxide semiconductors have high defect density in the conduction band, but display good p-type electrical properties. In some embodiments, semiconductor thin film 2202c comprises a tin oxide (SnOx), such as Tin (IV) oxide, or SnO2. In other embodiments, the tin oxide is Tin (II) oxide (SnO) or a mixture of SnO and SnO2, where x may range between 1 and 2. While the range of x may be expanded, semiconducting properties may be lost (e.g., the material becomes a pure conductor if x is to low, and a pure insulator if x is too high). In some other embodiments, semiconductor thin film 202c may comprise a zinc oxide (ZnOx), such as Zn(II) oxide, or ZnO. In other embodiments, the zinc oxide is zinc peroxide (ZnO2) or a mixture of ZnO and ZnO2, where x may range between 1 and 2. In some other embodiments, semiconductor thin film 202c comprises titanium oxide (TiOx), or SnOx. Exemplary oxide semiconductors that may have suitable p-type conductivity include copper oxide (CuOx). In some CuOx embodiments, oxide semiconductor thin film 202c is Cu(I) oxide, or Cu2O. In other embodiments, oxide semiconductor thin film 202c is Cu(II) oxide (CuO) or a mixture of CuO and Cu2O, where x may range between 0.5 and 1. Other exemplary oxide semiconductor thin film 202c compositions include NiOx.

Oxide semiconductor conductivity type is a function of composition. Although not bound by theory, the basis for n-type conductivity in many oxide semiconductors may be the presence of oxygen vacancies. The presence of other electrically active dopants, such as hydrogen, or one or more metal species, may also serve as a means of tuning the semiconducting properties of the oxide semiconductor. Semiconductor oxide thin film 202c may be intentionally doped, or not. Compared to intrinsic oxide semiconductor that is not intentionally doped, n-type and p-type oxide semiconductors may have a higher concentration of impurities, such as, but not limited to, one or more group III element, group V element, and/or elemental hydrogen (H). Dopant levels in oxide semiconductor thin film 202c may be selected to arrive at optimal threshold voltage associated with gating the oxide semiconductor within the channel region and/or for lowest bulk and/or junction resistance within the source/drain region. Semiconductor thin film 202c may comprise ZnOx doped with In and Ga, for example. While semiconductor oxides may display some level of structural ordering (e.g., nanocrystallinity), in some embodiments amenable to lowest processing temperatures, oxide semiconductor thin film 110 may be in an amorphous state. In some such embodiments, oxide semiconductor thin film 202c has a thickness of 5-20 nm.

In some embodiments, semiconductor thin film 202c may be substantially compositionally homogeneous. In some embodiments, the TFT channel region is coupled to source/drain contacts 202s, 202d through semiconductor homojunctions. In alternative embodiments, semiconductor thin film 202c is compositionally heterogeneous between the channel region and at least one source/drain region. The TFT channel region is then coupled to source/drain contact 202s, 202d through semiconductor heterojunctions.

In some embodiments, semiconductor thin film 202c may include material comprising amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, Si2BN, stanene, phosphorene, molybdenite, poly-III-V like InAs, InGaAs, InP, amorphous InGaZnO (a-IGZO), crystal-like InGaZnO (c-IGZO), GaZnON, ZnON, and/or C-Axis Aligned Crystal (CAAC) InGaZnO.

As illustrated in FIG. 3, in some embodiments, a passivation dielectric 342 may be disposed over the oxide semiconductor thin film 202c. In the illustrated embodiments, passivation dielectric 342 may be disposed over the channel region, spanning the channel length of oxide semiconductor 202c between source/drain contacts 202s, 202g. In some embodiments passivation dielectric 342 may include a metal oxide in contact with oxide semiconductor thin film 202c. The metal oxide may include at least one transition metal or post-transition metal species such as, but not limited to, Hf, Ta, Ti, Al, Mg, Cu, Zn, Sn, Ni, Ga, In, Sb, Sr, Cr, Co, V, or Mo. In some embodiments, the metal oxide employed as passivation dielectric 342 includes a metal species absent from oxide semiconductor thin film 202c. In some advantageous embodiments, the metal oxide comprises an oxide of Ti (e.g., TiO2), Al (e.g., Al2O3), or Hf (e.g., HfO2) in direct contact with oxide semiconductor thin film 202c. The metal oxide may be a suboxide (A2O), monoxide (AO), binary oxide (AO2), ternary oxide (ABO3), or mixture thereof. In addition to the metal and oxygen constituents, a passivation dielectric in accordance with some embodiments may further include nitrogen (i.e. a metal oxynitride), and silicon (i.e., a metal silicate). A suitable passivation dielectric may further include other minor (e.g., impurity-level) constituents, such as, but not limited to C, As, P, or B.

Source/drain contacts 202s, 202d may have any metal composition that when interfacing the chosen oxide semiconductor will, either as deposited, or upon subsequent annealing, have suitable contact resistance. Source/drain contacts 202s, 202d may advantageously have a relatively low affinity for oxygen to limit gettering oxygen from oxide semiconductor thin film 202c. In some embodiments, source/drain contacts 202s, 202d include a metal nitride at the interface of (i.e., in direct contact with) oxide semiconductor thin film 202c. Metal nitrides offer good stability and do not ready oxidize. Exemplary metal nitrides include TiN, TaN, and WN. In other exemplary embodiments, source/drain contacts 202s, 202d include a noble metal (e.g., Pt) at the interface of (i.e., in direct contact with) oxide semiconductor thin film 202c.

A capping dielectric 346 may be disposed over passivation dielectric 342. Capping dielectric 346 may have a composition different than that of passivation dielectric 342, and may for example include any conventional material suitable for ILD applications, such as, but not limited to SiO, SiN, SiON, and any known low-k dielectrics (e.g., having a relative permittivity less than 3.5). Capping dielectric 346 may also serve as a hermetic seal protecting interface between passivation dielectric 342 and oxide semiconductor thin film 202c.

In some embodiments, the source contact 202s of the transistor 102 may be coupled to the drain contact 222d of the transistor 104 via connection 294 (and via drain contact 222d). In an example, the connection 294 may comprise one or more metallization layers, one or more vias, etc., e.g., as illustrated in FIG. 3.

Although not depicted in FIG. 3, the terminals of the transistor 102 may be interconnected with one or more other TFT cells, by one or more interconnect metallization levels to form a functional integrated circuit.

In FIG. 3, the transistor 102 is implemented as a top-side gate architecture, with bottom-side source/drain contacts. For example, the source/drain contacts 202d and 202s may be between the transistor 104 and the gate 202g of the transistor 102, as illustrated in FIG. 3.

Figure 4:
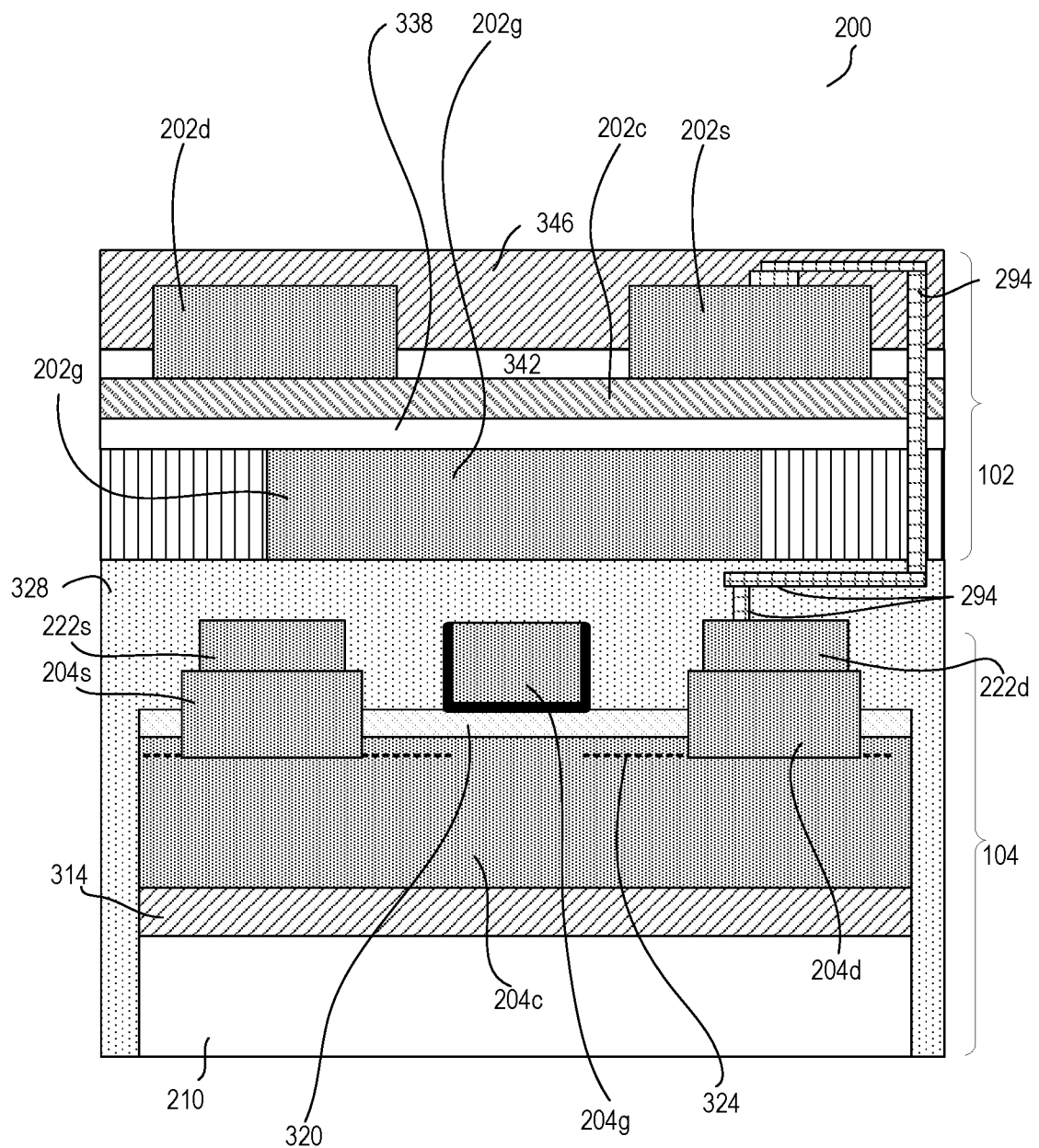
FIG. 4 illustrates a cross-sectional view of another example implementation of the semiconductor device of FIG. 2, in accordance with some embodiments.

In some embodiments, other type of TFT architecture may also be possible. For example, a TFT may include top-side source/drain contacts, and a top or bottom side gate stack. For example, FIG. 4 illustrates the transistor 102 being implemented as a top-side source/drain contacts and a bottom-side gate stack. In such an example, the connection 294 may traverse from the top side source contact 202s, traverse on a side of the transistor 102, and make contact with the drain contact 222d of the transistor 104. In FIG. 4, the gate 202g of the transistor 102 may be between: the source/drain contacts 202s, 202g, and the transistor 104, as illustrated in FIG. 4. The transistor 102 of FIG. 4 would be apparent to those skilled in the art, e.g., based on the discussion of the same transistor with respect to FIG. 3, and hence, FIG. 4 will not be discussed in further detail herein.

Although FIGS. 3 and 4 illustrate some example implementation of the transistor 102, any other implementation of an appropriate type of TFT may also be possible. For example, the TFT transistor 102 may be implemented as a top-side source/drain contacts and a top side gate stack, may be implemented as a bottom-side source/drain contacts and a bottom side gate stack, and/or the like. Furthermore, the TFT transistor 102 may have any additional (or less) layers compared to the illustrations in FIGS. 3 and 4.

Figure 5:
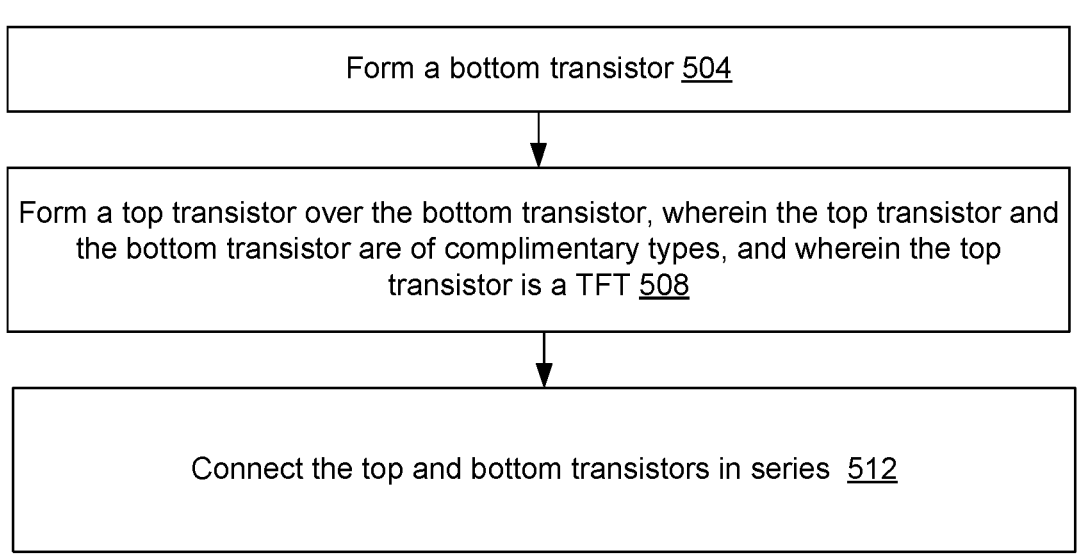
FIG. 5 is a flow diagram illustrating a method of forming the semiconductor device of FIGS. 2-4, in accordance with some embodiments.

FIG. 5 is a flow diagram illustrating a method 500 of forming the device 200 of FIGS. 2-4, in accordance with some embodiments. The method 500 begins at operation 504, where a bottom transistor (e.g., transistor 104 of FIGS. 2-4) is formed. In some embodiments, the bottom transistor may be any appropriate transistor formed using any appropriate technology. For example, the bottom transistor may be a III-N HFET, such as a HEMT, a MOS HEMT, or the like. In another example, the transistor 104 may be a silicon based transistor, a silicon based MOSFET, a III-V based transistor, or another appropriate type of transistor.

Referring again to FIG. 5, the method 500 may continue at operation 508, where a top transistor (e.g., the transistor 102 of FIGS. 2-4) may be formed over the bottom transistor. In some embodiments, the top transistor and the bottom transistor may be of complimentary types. In some embodiments, the top transistor may be a TFT. For example, the top transistor may comprise a TFT, e.g., formed using a thin film (e.g., as discussed with respect to FIGS. 3-4). For example, one or more layers or components of the top transistor (e.g., the oxide semiconductor thin film 202c of FIGS. 3-4) may be formed via an appropriate deposition process, such as, but not limited to pulsed laser deposition (PLD), oxidation processing where a precursor is spin-coated and oxidized during an anneal, chemical vapor deposition (CVD), atomic layer deposition (ALD), and/or the like. In some embodiments, the top and bottom transistors of FIG. 5 may be used to form an inverter circuit, e.g., as discussed with respect to FIGS. 1A-1B.

In some embodiments, the top transistor may be formed using any appropriate technique for forming a TFT. Merely as an example and although not illustrated in the figures, forming the top transistor may comprise depositing an oxide semiconductor thin film (e.g., semiconductor thin film 202c) that may act as a channel layer, depositing a passivation dielectric (e.g., passivation dielectric 342), wherein the passivation dielectric comprises a metal oxide, forming source/drain contacts (e.g., source/drain contacts 202s, 202d) to the oxide semiconductor thin film, forming a gate stack (e.g., gate stack 202g), etc.

Referring again to FIG. 5, the method 500 may continue at operation 512, where the top transistor and the bottom transistor may be connected in series, e.g., using the connector 294, as discussed with respect to FIGS. 2-4.

As discussed previously herein, in some embodiments, the bottom transistor may be an enhancement mode GaN based transistor, e.g., a III-N HFET, such as a HEMT, a MOS HEMT, or the like. Forming enhancement mode III-N HFET may be relatively easier than, for example, forming a depletion mode III-N HFET. Also, III-N HFET may be used in a plethora of applications, e.g., Radio Frequency (RF) communication (e.g., due to the relatively wide bandgap, high break down voltage of III-N HFETs). However, as it may be relatively difficult to form a depletion mode III-N HFET, a pair of III-N HFETs may not be used to form an inventor circuit that may be used for, for example, RF communication application. Moreover, if an enhancement mode III-N HFET and an adjacent depletion mode III-N HFET are used for an inverter, such a transistor pair may consume relatively high power.

To solve such issues, as discussed in this disclosure, in some embodiments, the depletion mode TFT may be used in conjunction with the enhancement mode III-N HFET, e.g., to form an inventor circuit for RF communication application (or for use in another application area). For example, the depletion mode TFT may be used as a load transistor, and the enhancement mode III-N HFET may be used as the driver transistor, e.g., as discussed with respect to FIGS. 1A, 1B, and 2.

In some embodiments, the TFT may have lower mobility and/or may consume low current (e.g., compared to a depletion mode HFET), as a result of which the inverter circuit comprising the TFT-HFET transistor pair may consume relatively less power. In some embodiments, using the inverter circuit comprising the TFT-HFET transistor pair may enable higher gain and lower power consumption for the inverter circuit. In some embodiments, the top transistor may be made into a three-dimensional (3D) stackable thin film transistor, which may be formed over the bottom HFET transistor, to enable smaller device footprints and higher density inverter circuits.

Figure 6:
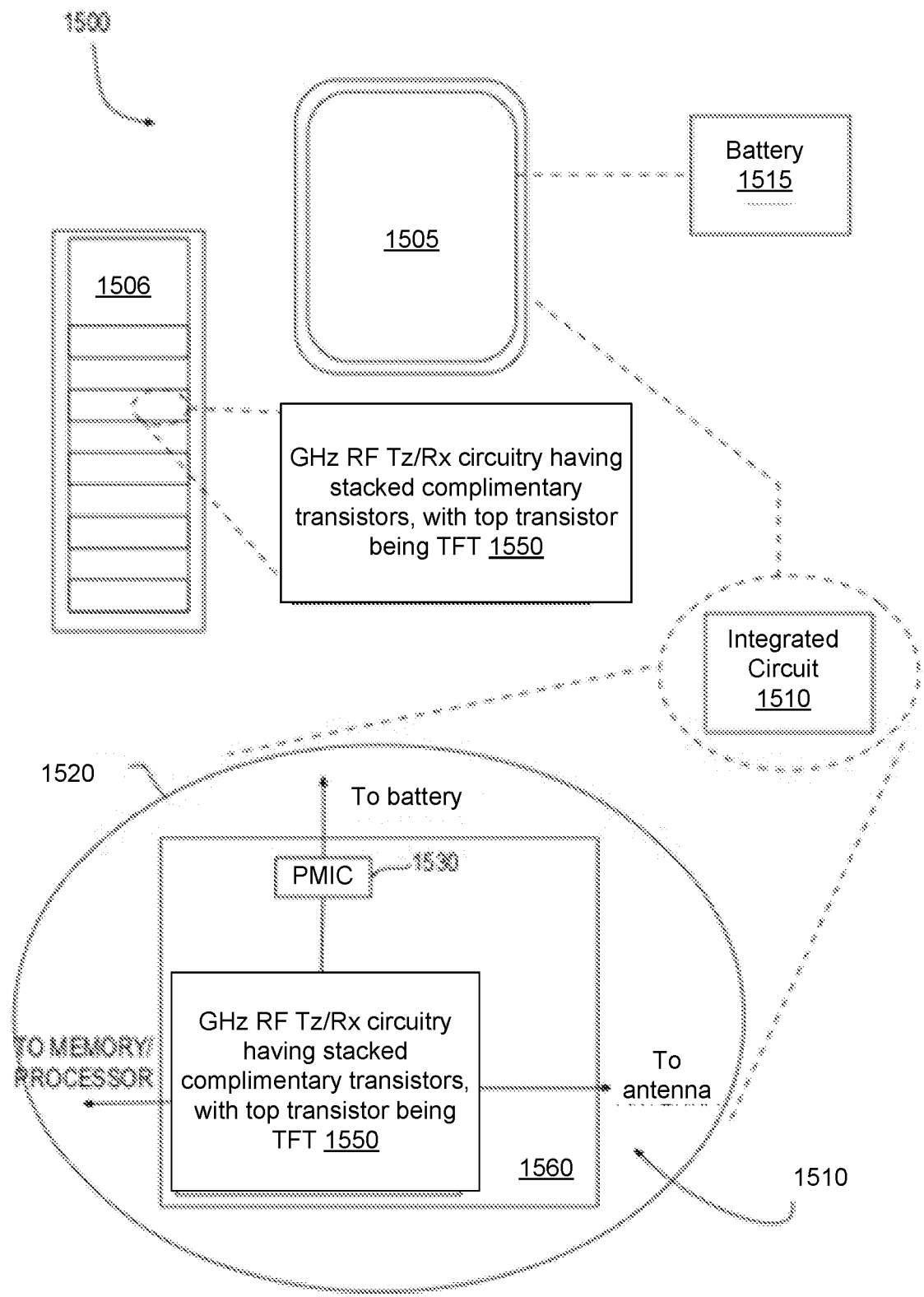
FIG. 6 illustrates a system in which a mobile computing platform and/or a data server machine employs an IC including at least one semiconductor device having stacked transistors, wherein a top transistor of the stack is a thin film transistor, and wherein the top and a bottom transistor is of complementary types, in accordance with some embodiments.

FIG. 6 illustrates a system 1500 in which a mobile computing platform 1505 and/or a data server machine 1506 employs an IC including at least one semiconductor device having stacked transistors, wherein a top transistor of the stack is a TFT, and wherein the top and a bottom transistor is of complementary types, in accordance with some embodiments. The server machine 1506 may be any commercial server, for example including any number of high-performance computing platforms disposed within a rack and networked together for electronic data processing, which in the exemplary embodiment includes a packaged monolithic IC 1550. The mobile computing platform 1505 may be any portable device configured for each of electronic data display, electronic data processing, wireless electronic data transmission, or the like. For example, the mobile computing platform 1505 may be any of a tablet, a smart phone, laptop computer, etc., and may include a display screen (e.g., a capacitive, inductive, resistive, or optical touchscreen), a chip-level or package-level integrated system 1510, and a battery 1515.

Whether disposed within the integrated system 1510 illustrated in the expanded view 1520, or as a stand-alone packaged chip within the server machine 1506, the IC 1550 includes at least one semiconductor device having stacked transistors, wherein a top transistor of the stack is a TFT, and wherein the top and a bottom transistor is of complementary types, for example as described elsewhere herein. In some embodiments, such a device may be used to implement an inverter circuit, for example as described elsewhere herein.

The IC 1550 may be further coupled to a board, a substrate, or an interposer 1560 along with a power management integrated circuit (PMIC). Functionally, PMIC 1530 may perform battery power regulation, DC-to-DC conversion, etc., and so has an input coupled to battery 1515 and with an output providing a current supply to other functional modules.

IC 1550, in some embodiments, includes RF (wireless) integrated circuitry (RFIC) further including a wideband RF (wireless) transmitter and/or receiver (TX/RX including a digital baseband and an analog front end module comprising a power amplifier on a transmit path and a low noise amplifier on a receive path). The RFIC includes at least one III-N HFET adjacent to a substrate tap, for example as described elsewhere herein. The RFIC has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 7:
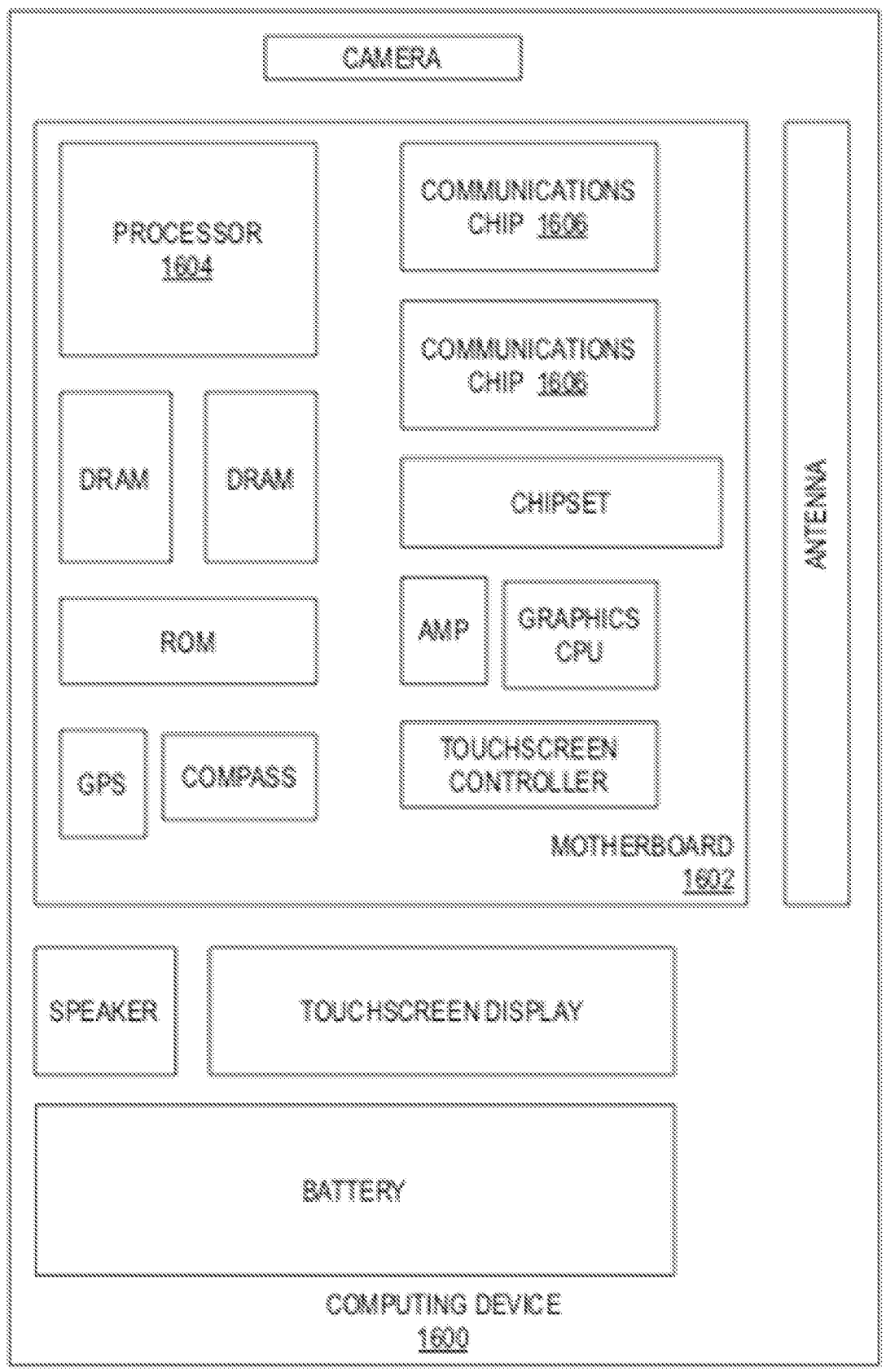
FIG. 7 is a functional block diagram of a computing device 1600, arranged in accordance with at least some implementations of the present disclosure.

FIG. 7 is a functional block diagram of a computing device 1600, arranged in accordance with at least some implementations of the present disclosure. Computing device 1600 may be found inside platform 1505 or server machine 1506, for example. Device 1600 further includes a motherboard 1602 hosting a number of components, such as, but not limited to, a processor 1604 (e.g., an applications processor), which may further incorporate at least one semiconductor device having stacked transistors, wherein a top transistor of the stack is a TFT, and wherein the top and a bottom transistor is of complementary types, in accordance with embodiments of the disclosure. Processor 1604 may be physically and/or electrically coupled to motherboard 1602. In some examples, processor 1604 includes an integrated circuit die packaged within the processor 1604. In general, the term "processor" or "microprocessor" may refer to any device or portion of a device that processes electronic data from registers and/or memory to transform that electronic data into other electronic data that may be further stored in registers and/or memory.

In various examples, one or more communication chips 1606 may also be physically and/or electrically coupled to the motherboard 1602. In further implementations, communication chips 1606 may be part of processor 1604. Depending on its applications, computing device 1600 may include other components that may or may not be physically and electrically coupled to motherboard 1602. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1606 may enable wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1606 may implement any of a number of wireless standards or protocols, including but not limited to those described elsewhere herein. As discussed, computing device 1600 may include a plurality of communication chips 1606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

Example 1. An apparatus comprising: a first device comprising an enhancement mode III-N heterostructure field effect transistor (HFET); a second device over the first device, wherein the second device comprises a depletion mode thin film transistor; and a connector to couple a first terminal of the first device to a first terminal of the second device.

Example 2. The apparatus of example 1 or any other example, wherein the second device comprises: a thin film comprising oxide semiconductor; and a gate stack coupled to the thin film.

Example 3. The apparatus of example 1 or any other example, further comprising: an inverter circuit that includes: a driver comprising the first device, and a load comprising the second device, wherein the first device is in series with the second device.

Example 4. The apparatus of any of examples 1-3 or any other example, wherein the second device comprises a gate that is between: the first device, and a source and a drain of the second device.

Example 5. The apparatus of any of examples 1-3 or any other example, wherein the second device comprises a source and a drain that are between: the first device, and a gate of the second device.

Example 6. The apparatus of any of examples 1-3 or any other example, further comprising: one or more levels of metal between the first device and the second device.

Example 7. The apparatus of example 6 or any other example, wherein the connector is realized using at least one of the one or more levels of metal.

Example 8. An apparatus comprising: a first device; and a second device over the first device, wherein the second device is a thin film transistor device, wherein a first terminal of the first device is coupled to a first terminal of the second device, and wherein the first device and the second device are of complimentary types.

Example 9. The apparatus of example 8 or any other example, wherein: the first device is one of an enhancement mode type or a depletion mode type; and the second device is another of the enhancement mode type or the depletion mode type.

Example 10. The apparatus of example 8 or any other example, wherein: the first device is an enhancement mode III-N heterostructure field effect transistor (HFET); and the second device is a depletion mode transistor.

Example 11. The apparatus of example 8 or any other example, wherein: the first device is a Gallium Nitride (GaN) based transistor comprising a channel layer, the channel layer comprising GaN.

Example 12. The apparatus of example 11 or any other example, wherein the first device comprises: a polarization layer adjacent to the channel layer, wherein the channel layer comprises a two-dimensional electron gas (2DEG) region formed near a junction of the polarization layer and the channel layer.

Example 13. The apparatus of any of examples 8-12 or any other example, wherein the second device comprises: a channel region; a gate electrode coupled to the channel region; and source/drain contacts coupled to ends of the channel region.

Example 14. The apparatus of example 13 or any other example, wherein the channel region is a thin film comprising an oxide semiconductor.

Example 15. The apparatus of any of examples 8-12 or any other example, further comprising: one or more levels of metal between the first device and the second device, wherein the first terminal of the first device is coupled to the first terminal of the second device using the one or more levels of metal.

Example 16. The apparatus of any of examples 8-12 or any other example, further comprising: an inverter circuit that includes: a driver comprising the first device, and a load comprising the second device.

Example 17. A method comprising: forming a first transistor; forming a second transistor over the first transistor, wherein the second transistor is a thin film transistor, and wherein the first transistor and the second transistor are of complimentary types; and connecting the first transistor and the second transistor in series.

Example 18. The method of example 17 or any other example, wherein forming the first transistor comprises: forming a channel layer comprising Gallium Nitride (GaN); and forming a polarization layer adjacent to the channel layer, wherein the channel layer comprises a two-dimensional electron gas (2DEG) region formed near a junction of the polarization layer and the channel layer.

Example 19. The method of example 18 or any other example, wherein forming the first transistor comprises: forming a source and a drain adjacent to the polarization layer, the source and the drain comprises heavily-doped III-N material having a n-type impurity dopant concentration; and forming a gate stack adjacent to the polarization layer.

Example 20. The method of any of examples 17-19 or any other example, wherein forming the second transistor comprises: depositing a thin film comprising oxide semiconductor to form a channel layer; forming source/drain contacts adjacent to the thin film; and forming a gate stack adjacent to the thin film.

Example 21. The method of any of examples 17-19 or any other example, wherein connecting the first transistor and the second transistor in series comprises: forming one or more layers comprising metal, the one or more layers connecting a first terminal of the first transistor to a first terminal of the second transistor.

Example 22. An apparatus comprising: means for performing the method of any of the examples 17-21 or any other example.

Example 23. An apparatus comprising: means for forming a first transistor; means for forming a second transistor over the first transistor, wherein the second transistor is a thin film transistor, and wherein the first transistor and the second transistor are of complimentary types; and means for connecting the first transistor and the second transistor in series.

Example 24. The apparatus of example 23 or any other example, wherein the means for forming the first transistor comprises: means for forming a channel layer comprising Gallium Nitride (GaN); and means for forming a polarization layer adjacent to the channel layer, wherein the channel layer comprises a two-dimensional electron gas (2DEG) region formed near a junction of the polarization layer and the channel layer.

Example 25. The apparatus of example 23 or any other example, wherein the means for forming the first transistor comprises: means for forming a source and a drain adjacent to the polarization layer, the source and the drain comprises heavily-doped III-N material having a n-type impurity dopant concentration; and means for forming a gate stack adjacent to the polarization layer.

Example 26. The apparatus of any of examples 23-25 or any other example, wherein the means for forming the second transistor comprises: means for depositing a thin film comprising oxide semiconductor to form a channel layer; means for forming source/drain contacts adjacent to the thin film; and means for forming a gate stack adjacent to the thin film.

Example 27. The apparatus of any of examples 23-25 or any other example, wherein the means for connecting the first transistor and the second transistor in series comprises: means for forming one or more layers comprising metal, the one or more layers connecting a first terminal of the first transistor to a first terminal of the second transistor.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

We claim:

1. An apparatus comprising:
   a first device comprising an enhancement mode III-N heterostructure field effect transistor (HFET);
   a second device over the first device, wherein the second device comprises a depletion mode thin film transistor, wherein the second device includes a layer comprising an oxide semiconductor extending laterally from a source terminal of the second device to a drain terminal of the second device, and a gate stack coupled to the layer; and
   a connector to couple a source terminal of the first device to the drain terminal of the second device, or couple a drain terminal of the first device to the source terminal of the second device.

2. The apparatus of claim 1, wherein the gate stack is coupled to a backside of the layer, and the source and the drain terminals of the second device are coupled to a frontside of the layer.

3. The apparatus of claim 1, further comprising:
   an inverter circuit that includes:
      a driver comprising the first device, and
      a load comprising the second device,
   wherein the first device is in series with the second device.

4. The apparatus of claim 1, wherein the gate stack of the second device is between:
   the first device, and
   the source and drain terminals of the second device.

5. The apparatus of claim 1, further comprising:
   one or more levels of metal between the first device and the second device, wherein the connector includes at least one of the one or more levels of metal.

6. The apparatus of claim 1, wherein the gate stack of the second device is in contact with the layer comprising the oxide semiconductor.

7. The apparatus of claim 1, wherein the gate stack is in contact with a first side of the layer, and the source and the drain terminals of the second device are in contact with a second side of the layer that is opposite the first side.

8. The apparatus of claim 1, wherein the gate stack is coupled to a frontside of the layer comprising the oxide semiconductor, and the source and the drain terminals of the second device are coupled to a backside of the layer comprising the oxide semiconductor.

9. The apparatus of claim 1, wherein the layer comprising the oxide semiconductor is a channel region of the second device, and wherein the layer has a thickness in the range of 5-20 nanometers (nm).

10. An apparatus comprising:
    a first device that is a III-N field effect transistor; and
    a second device above the first device,
    wherein the second device comprises (i) a source terminal and a drain terminal, (ii) a body comprising a semiconductor material including a metal and oxygen, the body extending laterally from the source terminal of the second device to the drain terminal of the second device, and (ii) a gate stack coupled to the body,
    wherein a source terminal of the first device is coupled to the drain terminal of the second device, or a drain terminal of the first device is coupled to the source terminal of the second device, and
    wherein the first device is one of an enhancement mode transistor or a depletion mode transistor, and the second device is the other of the enhancement mode transistor or the depletion mode transistor.

11. The apparatus of claim 10, wherein:
    the first device is an enhancement mode III-N heterostructure field effect transistor (HFET); and
    the second device is a depletion mode thin film transistor.

12. The apparatus of claim 10, wherein the first device comprises a channel layer, the channel layer comprising gallium and nitrogen.

13. The apparatus of claim 12, wherein the first device comprises:
    a polarization layer adjacent to the channel layer,
    wherein the channel layer comprises a two-dimensional electron gas (2DEG) region near a junction of the polarization layer and the channel layer.

14. The apparatus of claim 10, wherein the gate stack is in contact with a first side of the body, and the source and the drain terminals of the second device are in contact with a second side of the body that is opposite the first side.

15. The apparatus of claim 10, further comprising:
one or more levels of metal between the first device and the second device,
wherein
using the one or more levels of metal, one of (i) the source terminal of the first device is coupled to the drain terminal of the second device, or (ii) the drain terminal of the first device is coupled to the source terminal of the second device.

16. The apparatus of claim 10, comprising:
an inverter circuit that includes:
a driver comprising the first device, and
a load comprising the second device.

17. An integrated circuit comprising:
a first device comprising an enhancement mode III-N heterostructure field effect transistor (HFET) that includes gallium and nitrogen;
a second device over the first device, the second device comprising a depletion mode thin film transistor (TFT) that includes (i) a body comprising oxide semiconductor, (ii) a source or drain terminal above the body, and (iii) a gate stack below the body; and
a connector to couple a first terminal of the first device to a first terminal of the second device.

18. The integrated circuit of claim 17, wherein the gate stack is a first gate stack, and wherein the HFET comprises a second gate stack.

19. The integrated circuit of claim 17, wherein the a gate stack of the first device includes a first high-k gate dielectric, and the gate stack of the TFT includes a second high-k gate dielectric, and wherein the HFET and the TFT are operatively coupled in an inverter circuit configuration.

20. The integrated circuit of claim 17, wherein: the HFET comprises a polarization layer between a gate structure and a layer of gallium nitride; and the TFT comprises the source terminal on the oxide semiconductor and the drain terminal on the oxide semiconductor.

* * * * *